United States Patent [19]

Hayashi et al.

[11] Patent Number: 4,777,637
[45] Date of Patent: Oct. 11, 1988

[54] INTERFEROMETRIC SEMICONDUCTOR LASER DEVICE

[75] Inventors: Hiroshi Hayashi, Kyoto; Osamu Yamamoto; Saburo Yamamoto, both of Nara, all of Japan

[73] Assignee: Sharp Kabushiki Kaisha, Osaka, Japan

[21] Appl. No.: 804,575

[22] Filed: Dec. 4, 1985

[30] Foreign Application Priority Data

Dec. 5, 1984 [JP] Japan ................................ 59-258120

[51] Int. Cl.$^4$ .............................................. H01S 3/19
[52] U.S. Cl. ..................................... 372/48; 372/45; 372/46
[58] Field of Search ................. 372/48, 45, 46, 44, 372/50

[56] References Cited

U.S. PATENT DOCUMENTS 4,166,253  8/1979  Small et al. ............................ 372/46
4,592,060  5/1986  Hayakawa et al. ..................... 372/48

FOREIGN PATENT DOCUMENTS 0141778  11/1980  Japan ..................................... 372/48
1596820   9/1981  United Kingdom .

Primary Examiner—James W. Davie
Assistant Examiner—Georgia Y. Epps
Attorney, Agent, or Firm—Armstrong, Nikaido, Marmelstein & Kubovcik

[57] ABSTRACT

An interferometric semiconductor laser device having a built-in effective refraction index difference, based on the absorption of light by a substrate, between the portion of the active layer corresponding to the inside area of a striped channel formed on the surface of said substrate and the portion of the active layer corresponding to the outside area of said striped channel, wherein regions, which are positioned between the active layer and the substrate in the outside area of said channel along a waveguide formed in the active layer corresponding to said channel, are different from each other in the distance between the active layer and the substrate, thereby creating a difference in the effective refraction index between the portions of the active layer corresponding to said regions.

3 Claims, 3 Drawing Sheets

INTERFEROMETRIC SEMICONDUCTOR LASER DEVICE

BACKGROUND OF THE INVENTION

1. Field of the invention:

This invention relates to a semiconductor laser device, especially an interferometric semiconductor laser device, which has excellent stability in longitudinal mode characteristics at oscillation.

2. Description of the prior art:

When a semiconductor laser device is used as the light source for optical communication or optical information processing systems, it is most desirable that the device attains stabilized oscillation, unaffected by the ambient temperature or the laser light output power, or by reflected light of the laser beam reflected by an external system. When the oscillation condition of a semiconductor laser device is unstable due to changes in various factors such as those mentioned above, mode competition noise or feedback-induced noise can occur due to the mutual interaction between the longitudinal laser modes and/or the longitudinal laser modes and the external modes. Also, light transmission using optical fibers leads to modal noise, resulting in a serious lowering of the capacity of the system.

Therefore, for the purpose of stabilizing the longitudinal mode characteristics at oscillation in such conventional semiconductor laser devices, a number of proposals have been made.

First, there are laser devices with high-reflectivity mirrors for the prevention of the reentry of reflected light into the laser and for an increase in the internal optical density therein resulting in the suppression of the non-lasing mode. However, these laser devices have the disadvantage of not allowing much output light to be emitted. Second, there are distributed-feedback (DFB) laser devices and distributed Bragg reflector (DBR) laser devices that contain a grating inside the waveguide. These laser devices, with strong wave selectivity made possible by this grating, have excellent stability in the longitudinal mode even at laser light turbulence. However, the process of manufacturing these devices is a complex one, and depending on the quality of the materials therefor, these devices cannot be manufactured properly. Third, there are $C^3$ (cleaved coupled cavity) laser devices constructed by placing two semiconductor lasers or two waveguides in a line at the facets thereof. These laser devices are designed to give stability by the optical coupling of the two lasers in the longitudinal mode. However, the drawbacks of these devices are that it is difficult to dispose two laser devices so as to achieve good optical coupling, and that in order to bring about stability in the longitudinal mode over a wide range, by controlling individually the injection of carriers into the two laser devices, a high level of technical skill is required. Fourth, there are interferometric laser devices in which, by the construction of one or many reflecting sections in the inside of the waveguide of one semiconductor laser device, the entire waveguide can be divided into a number of parts, and by an interference effect between the longitudinal modes in each of these parts, stability in the longitudinal modes is achieved. An interferometric laser device has been proposed by Shyh Wang, et al., in the TEEE Journal of Quantum Electronics, vol. QE-18, No. 4, on page 610, April, 1982. In this laser, if the internal reflecting sections can be easily produced, a special manufacturing process will not be necessary, and the stability of the longitudinal mode should be good.

SUMMARY OF THE INVENTION

The semiconductor laser device of this invention which overcomes the above-discussed and numerous other disadvantages and deficiencies of the prior art, is an interferometric semiconductor laser device having a built-in effective refraction index difference, based on the absorption of light by a substrate, between the portion of the active layer corresponding to the inside area of a striped channel formed on the surface of the substrate and the portion of the active layer corresponding to the outside area of the striped channel, wherein regions, which are positioned between the active layer and the substrate in the outside area of the channel along a waveguide formed in the active layer corresponding to said channel, are different from each other in the distance between the active layer and the substrate, thereby creating a difference in the effective refraction index between the portions of the active layer corresponding to the regions.

The active layer is, in a preferred embodiment, of a flat layer with a uniform thickness.

The substrate has, in a preferred embodiment, a second channel which intersects the first channel.

A current blocking structure is, in a preferred embodiment, formed in the outside area of the first channel on the substrate.

Thus, the invention described herein makes possible the objects of (1) providing a semiconductor laser device, particularly an interferometric semiconductor laser device, which attains excellent stability in an oscillation longitudinal mode due to an internal reflecting section formed within the waveguide of the active layer by a simple technique; (2) a semiconductor laser device in which, by the use of an substrate having two kinds of striped channels crossed thereon, regions positioned between the active layer and the substrate in the outside area of one of the channels is different in the distance between the active layer and the substrate, thereby making a difference in the effective refraction index between the portions of the active layer corresponding to the regions, resulting in an internal reflecting section within a waveguide of the active layer corresponding to the channel.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

According to this invention, a reflecting region is formed within the waveguide of an index guided semiconductor laser device having a built-in effective refraction index difference, based on a difference in light absorption by the substrate, between the portion of the active layer corresponding to the inside area of a channel formed on the substrate and the portion of the active layer corresponding to the outside area of the channel, resulting in an interferometric laser device which can attain excellent stability in an oscillation longitudinal mode. The formation of a reflecting region within the waveguide is carried out in such a manner that the thickness of a portion of the cladding layer, which is positioned between the substrate and the active layer in the outside area of the channel, is allowed to be different from that of the other specific portion of the said cladding layer positioned along the waveguide, thereby allowing for a difference in the transverse effective refraction index between the portion of the active layer corresponding to the said specific portion of the cladding layer and the other portion of the active layer corresponding to the other portion of the cladding layer in the outside area of the channel.

Figure 1:
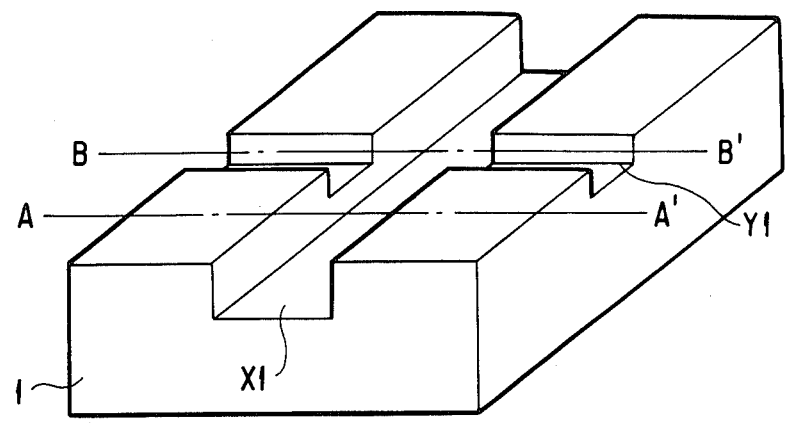
FIG. 1 is a perspective view of the substrate used for the formation of a semiconductor laser device of this invention.
Figures 2A, 2B:
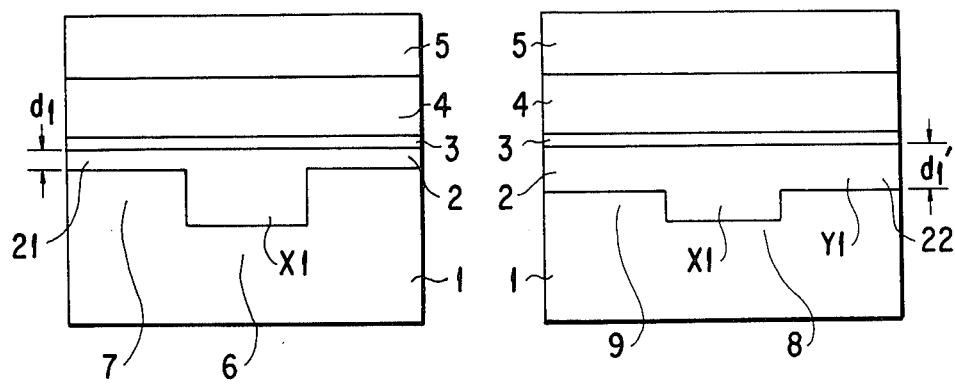
FIGS. 2(A) and 2(B), respectively, are sectional views at lines A—A' and B—B' in FIG. 1 in the case where a multi-layered crystal for laser oscillation is formed on the substrate shown in FIG. 1.
Figure 3A:
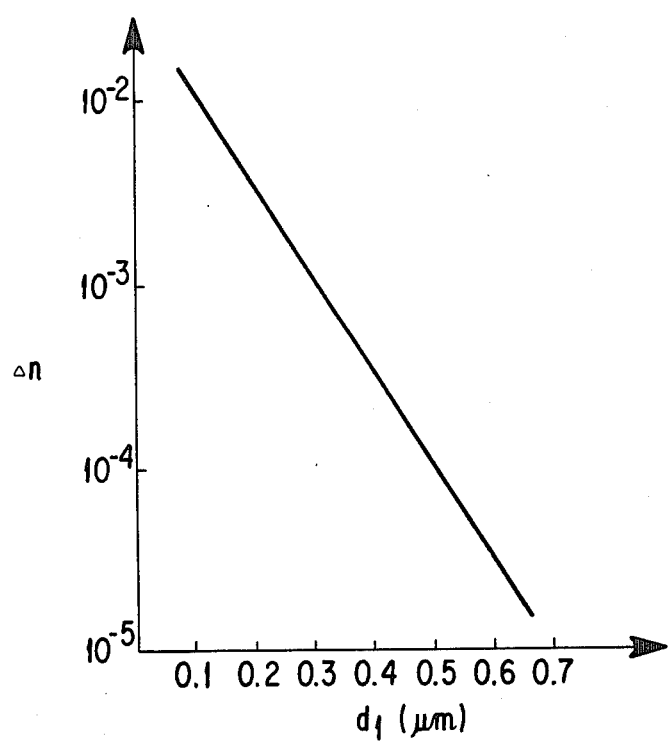
FIGS. 3(A) and 3(B), respectively, are a graph and a diagram showing the dependence of the built-in difference of the effective refraction index of the active layer on the thickness of the cladding layer.
Figure 3B:
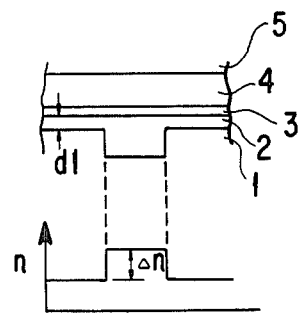

This invention is described below in detail by reference to drawings: FIG. 1 is a perspective view of the substrate 1 used for the formation of a semiconductor laser device of this invention. FIGS. 2(A) and 2(B), respectively, are sectional views at lines A—A' and B—B' shown in FIG. 1 in the case where, on the substrate 1, having striped channels X1 and Y1 crossed thereon, a cladding layer 2, an active layer 3, a cladding layer 4 and a cap layer 5 are successively formed by an epitaxial growth technique, resulting in a double-heterostructure multi-layered crystal for laser oscillation. As seen from FIGS. 2(A) and 2(B), the thickness $d_1$, of the portion 22 of the cladding layer 2, which is positioned between the substrate 1 and the active layer 3 in the outside area 9 of the channel X1 but in the inside area of the channel Y1, is greater than the thickness $d_1$ of the portion 21 of the cladding layer 22 positioned in the outside area 7 of both the channels X1 and Y1. FIGS. 3(A) and 3(B), respectively, show the relationship between the thickness $d_1$ of a portion of the cladding layer positioned in the outside area of the channel X1 and the transverse difference of the effective refraction index $\Delta n$ based on the difference in light absorption by the portion of the substrate positioned in the inside area of the channel X1 or the outside area of the channel X1, indicating that when the thickness $d_1$ of the cladding layer portion 21 in FIG. 2(A) is, for example, 0.1 $\mu$m and the thickness $d_1'$ of the cladding layer portion 22 in FIG. 2(B) is, for example, 0.5 $\mu$m, the effective refraction index differences $\Delta n$ nearly equal $10^{-2}$ at the A—A' area and $10^{-4}$ at the B—B' area, respectively, and accordingly laser light which is propagated within the waveguide of the active layer 3 corresponding to the channel X1 is partly reflected in the B—B' area of the waveguide due to the change of the effective refraction index in the B—B' area. Thus, according to this invention, the distribution of the distance between the substrate and the active layer is created by the formation of two kinds of channels X1 and Y1 crossed on the substrate to thereby form an internal reflecting section, resulting in an interferometric laser device which attains excellent stability in an oscillation longitudinal mode.

From the standpoint of the stabilization in a transverse mode and/or the decrease in emission loss in the reflecting region, as shown in FIGS. 2(A) and 2(B), it is preferable that the active layer is formed to be flat with a uniform thickness in not only the waveguiding region but also the reflecting region. Moreover, a current blocking function can be added to the reflecting region, as desired, resulting in a structure which prevents the reflecting region from obtaining gain to thereby more effectively increase the internal reflection index.

(EXAMPLE)

Figure 4:
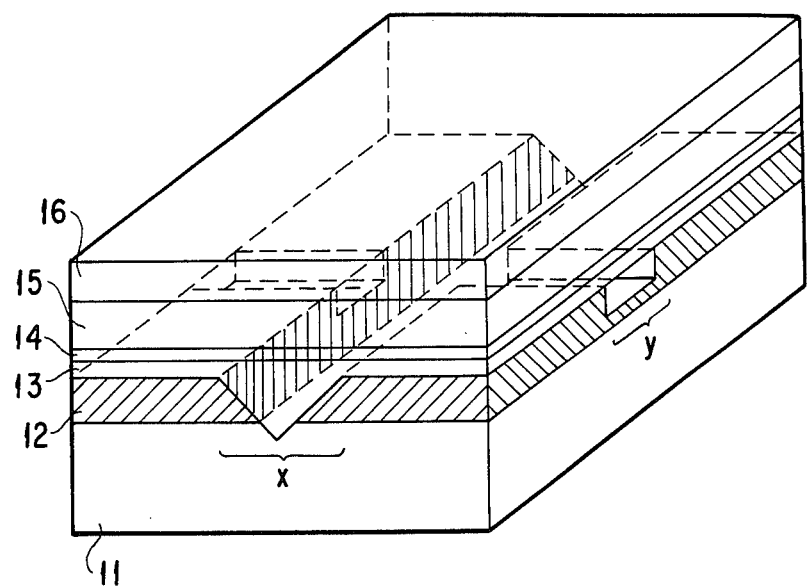
FIG. 4 is a perspective view showing an interferometric semiconductor laser device of this invention.

FIG. 4 shows an interferometric VSIS (V-channeled substrate inner stripe) laser device of this invention, which is produced as follows: On the (100) face of a p-GaAs substrate 11, an n-GaAs current blocking layer 12 having a thickness of 0.8 $\mu$m is grown by liquid phase epitaxy. Then, the current blocking layer 12 is subjected to an etching treatment to form a striped V-channel X having a width of 4 $\mu$m in the (01$\bar{1}$) direction in such a manner that the channel X reaches the substrate 11. The current blocking layer 12 is further etched to form another striped channel Y having a width of 3 $\mu$m and a depth of, for example, 0.5 $\mu$m in the (011) direction in such a manner that the channel Y does not reach the substrate 11. On the substrate 11 having the striped channels X and Y thereon, a p-Ga$_{1-y}$Al$_y$As cladding layer 13, a p-Ga$_{1-x}$Al$_x$As active layer 14, an n-Ga$_{1-y}$Al$_y$As cladding layer 15 and an n-GaAs cap layer 16 are successively grown by liquid phase epitaxy, resulting in a double-heterostructure multi-layered crystal for laser oscillation. The upper surface of the p-cladding layer 13 is flat, and accordingly the active layer 14 is formed into a flat shape having a uniform thickness.

The portion of the active layer 14 corresponding to the striped channel X functions as a built-in waveguide and the portion of the active layer 14 corresponding to the section at which the striped channel X and the striped channel Y cross functions as a reflecting section.

As mentioned above, due to the striped channel Y formed on the substrate 11, the thickness of the portion of the cladding layer 13 which is positioned in the outside area of the striped channel X, but in the inside area of the striped channel Y, is greater than that of the other portion of the cladding layer 13 positioned in the outside area of the channel X, so that the amount of light in the active layer 14 to be absorbed by the substrate 11 varies depending upon the thickness of the portion of the cladding layer 13 (i.e., the distance between the active layer 14 and the substrate 11), causing a difference in the effective refraction index of the active layer 14 which results in an internal reflecting section within the waveguide of the active layer 14. The resulting interferometric VSIS laser device has a cavity length of 250 $\mu$m, which is divided by this reflecting section into two waveguide parts having lengths of 100 $\mu$m and 150 $\mu$m, respectively.

Figure 5:
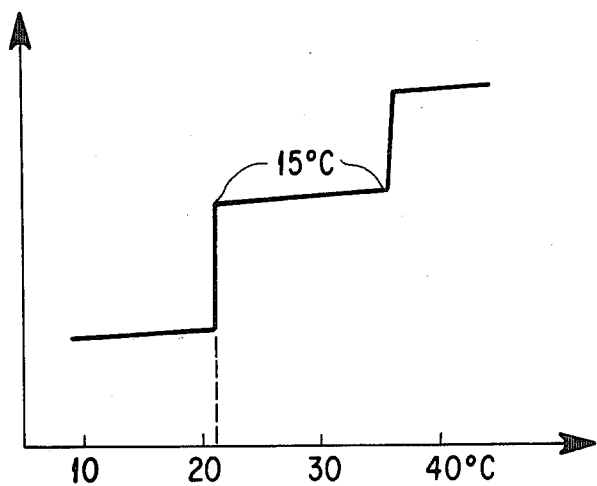
FIG. 5 is a characteristic curve showing the dependence of the oscillation longitudinal mode of the semiconductor laser device shown in FIG. 4 on temperature.

This interferometric VSIS laser device has a stabilized longitudinal mode characteristic, which exhibits no mode hopping over the temperature range of approximately 15° C. at an ambient temperature as seen from FIG. 5 showing the dependence of the laser oscillation longitudinal mode on temperature (wherein the oscillation threshold current Ith was approximately 40 mA at an ambient temperature).

In order to attain an improved stability in an oscillation longitudinal mode, it is preferable that the internal reflecting section is designed to be a non-injection region by forming an n-GaAs current blocking layer at the section at which the channel X and the channel Y cross on the substrate.

Although a GaAlAs system VSIS laser device is described in the above-mentioned example, this invention is not limited thereto. Any semiconductor materials and any current blocking mechanisms known by those skilled in the art can be applied to this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In an interferometric semiconductor laser device comprising:
    a semiconductor substrate;
    a first electrode formed under said substrate;
    a first channel formed on a surface of said substrate;
    a first cladding layer formed on said substrate and filling said first channel;
    an active layer formed on said first cladding layer;
    a second cladding layer formed on said active layer;
    a contact layer formed on said second cladding layer; and
    a second electrode formed on said contact layer; said laser device having a built-in effective refraction index difference, based on the absorption of light by said substrate, between a first portion of said active layer corresponding to an inside area of said first channel and a second portion of said active layer corresponding to an outside area of said first channel, thereby forming a waveguide in said active layer corresponding to said first channel wherein:
    a second channel, intersecting said first channel and filled with said first cladding layer, is formed on the surface of said substrate, and a first region of said first cladding layer, which corresponds to an inside of said second channel, is different in thickness from a second region of said first cladding layer, which corresponds to said second portion of the active layer and also to an outside of said second channel, therein creating, along said active waveguide, a difference in an effective refraction index between zones of said active layer corresponding to said regions of the first cladding layer.

2. An interferometric semiconductor laser device according to claim 1, wherein said active layer is of a flat layer with a uniform thickness.

3. An interferometric semiconductor laser device according to claim 1 or 2, wherein a current blocking structure is formed in the outside area of the first channel on the substrate.

* * * * *